(12) United States Patent
Haimoto et al.

(10) Patent No.: US 9,716,040 B2
(45) Date of Patent: Jul. 25, 2017

(54) WAFER PROCESSING METHOD USING ADHESIVE TAPE TO PICK UP DEVICE CHIPS

(71) Applicant: DISCO CORPORATION, Tokyo (JP)

(72) Inventors: Takashi Haimoto, Tokyo (JP); Hideki Koshimizu, Tokyo (JP); Yurika Araya, Tokyo (JP); Tetsukazu Sugiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/234,587

(22) Filed: Aug. 11, 2016

(65) Prior Publication Data

US 2017/0053830 A1 Feb. 23, 2017

(30) Foreign Application Priority Data

Aug. 21, 2015 (JP) ................................ 2015-163365

(51) Int. Cl.
| | |
|---|---|
| *H01L 21/78* | (2006.01) |
| *H01L 21/306* | (2006.01) |
| *H01L 21/304* | (2006.01) |
| *H01L 21/683* | (2006.01) |

(52) U.S. Cl.
CPC ............ *H01L 21/78* (2013.01); *H01L 21/304* (2013.01); *H01L 21/30604* (2013.01); *H01L 21/6836* (2013.01); *H01L 2221/6834* (2013.01); *H01L 2221/68327* (2013.01); *H01L 2221/68336* (2013.01)

(58) Field of Classification Search
CPC ..... H01L 21/78; H01L 21/304; H01L 21/268; H01L 21/6835; H01L 23/544; H01L 21/30604; H01L 2221/6834; H01L 2223/54453
See application file for complete search history.

(56) References Cited

U.S. PATENT DOCUMENTS

| 2004/0113283 A1* | 6/2004 | Farnworth .......... H01L 21/3043 257/782 |
|---|---|---|
| 2006/0154447 A1* | 7/2006 | Kushima ................. H01L 21/78 438/460 |

FOREIGN PATENT DOCUMENTS

| JP | 2000-182995 | 6/2000 |
|---|---|---|
| JP | 2002-118081 | 4/2002 |
| JP | 2006-294913 | 10/2006 |

* cited by examiner

*Primary Examiner* — Selim Ahmed
(74) *Attorney, Agent, or Firm* — Greer Burns & Crain Ltd.

(57) ABSTRACT

A wafer processing method of processing a wafer with a plurality of devices disposed in areas demarcated by projected division lines and formed on a face side thereof includes a protective member placing step of placing a protective member for protecting the face side of the wafer on the face side of the wafer which is divided into individual device chips, a resin laying step of laying a die-bonding resin on the reverse sides of the individual device chips by applying a die-bonding liquid resin on the reverse side of the wafer and hardening the applied die-bonding liquid resin, and a separation step of separating the device chips with the die-bonding liquid resin laid on the reverse sides thereof from the wafer.

9 Claims, 7 Drawing Sheets

WAFER PROCESSING METHOD USING ADHESIVE TAPE TO PICK UP DEVICE CHIPS

BACKGROUND OF THE INVENTION

Field of the Invention

The present invention relates to a wafer processing method of processing a wafer to form a plurality of device chips with a die-bonding resin provided on the reverse sides thereof.

Description of the Related Art

In the step of fabricating semiconductor devices for use on ICs (Integrated Circuits), LSI (Large Scale Integration) circuits, etc., a wafer with a plurality of devices disposed in areas demarcated by projected division lines and formed on its face side is divided into individual device chips, thereby producing semiconductor device chips. The semiconductor device chips are then packaged for use in electric devices such as mobile phones, personal computers, etc.

The semiconductor device chips are bonded to lead frames (metal boards) or the like. There is known in the art a step of laying a bonding material for bonding the semiconductor device chips to lead frames on the reverse sides of the semiconductor device chips. According to the known step, a DAF (Die Attach Film) which is of approximately the same size as the wafer is applied to the reverse side of the wafer prior to its being divided into individual device chips, and then the wafer is divided into individual device chips by a cutting blade that cuts into the face side of the wafer. At the same time, the bonding material on the reverse side of the wafer is also divided into pieces corresponding to the individual device chips. In this manner, the individual device chips are separated and taken from the wafer as semiconductor device chips each with the bonding material on its reverse side. Reference may be made to Japanese Patent Laid-Open No. 2000-182995, for example.

The above method of laying the bonding material is based on the premise that the wafer is ground (thinned) to a desired thickness from the reverse side thereof, and then the DAF is applied to the ground reverse side of the wafer, after which the wafer is diced from the face side into the individual device chips. However, if there is employed a technology referred to as "dicing before grinding" wherein a dicing step is carried out on face side of a wafer by a cutting blade to form separation grooves having a depth corresponding to a finished thickness and thereafter the reverse side of the wafer is ground to divide the wafer into individual device chips, then it is difficult to rely on the above laying method because the wafer is divided into individual device chips at the same time that the grinding of the reverse side of the wafer is completed.

For laying a bonding material, e.g., a die-bonding resin, on the reverse sides of device chips in the "dicing before grinding" step, attempts have been made to apply a die-bonding resin film to the entire reverse side of a wafer after the wafer is diced into individual semiconductor device chips and before the individual semiconductor device chips are taken from the wafer, and to apply a laser beam to the wafer from the side of the separation grooves in the face thereof, thereby dividing the die-bonding resin film into pieces corresponding to the semiconductor device chips (see, for example, Japanese Patent Laid-Open No. 2002-118081). The separation grooves whose depth corresponds to the finished thickness of the device chips may be formed along the projected division lines by etching or the like, rather than the cutting blade (see, for example, Japanese Patent Laid-Open No. 2006-294913).

SUMMARY OF THE INVENTION

According to the above method of laying the die-bonding resin in the "dicing before grinding" step, it is necessary to cut the die-bonding resin film applied to the reverse side of the wafer apart from dividing the wafer into the individual device chips, so that the entire step will be relatively complex. Moreover, the projected division lines after the wafer is divided into the individual semiconductor device chips subsequently to the grinding of the reverse side after the dicing of the wafer tend to vary in width and position from the projected division lines before the wafer is divided into the individual semiconductor device chips and to lose their linearity under the load imposed from a grinding abrasive used to grind the reverse side of the wafer. Therefore, it may be difficult to divide the wafer along the projected division lines with physical processing means, so that the productivity of semiconductor device chips may be lowered.

It is therefore an object of the present invention to provide a method of processing a wafer to lay a die-bonding resin on the reverse sides of semiconductor device chips to be divided from the wafer by the "dicing before grinding" step, without causing a reduction in the productivity of semiconductor device chips.

In accordance with an aspect of the present invention, there is provided a wafer processing method of processing a wafer with a plurality of devices formed in areas demarcated by projected division lines on a face side thereof. The wafer processing method includes a protective member placing step of placing a protective member for protecting the face side of the wafer on the face side of the wafer which is divided into individual device chips, a resin laying step of laying a die-bonding resin on the reverse sides of the individual device chips by applying a die-bonding liquid resin on the reverse side of the wafer and hardening the applied die-bonding liquid resin, and a separation step of separating the device chips with the die-bonding liquid resin laid on the reverse sides thereof from the wafer.

Preferably, the protective member placing step includes a separation groove forming step of forming separation grooves corresponding to a finished thickness of the device chips, in the face side of the wafer along the projected division lines before the protective member is placed on the face side of the wafer, a protective member applying step of applying the protective member to the face side of wafer with the separation grooves formed therein, and a dividing step of dividing the wafer into the individual device chips by thinning the wafer to expose the separation grooves on the reverse side of the wafer.

In the separation groove forming step, the separation grooves having a depth corresponding to the finished thickness of the device chips may be formed by causing a cutting blade to cut into the face side of the wafer along the projected division lines, or by carrying out a wet etching step or a dry etching step, or by applying a laser beam along the projected division lines.

The dividing step preferably includes grinding the reverse side of the wafer to thin the wafer, thereby exposing the separation grooves on the reverse side of the wafer.

Preferably, after the resin laying step, a transferring step may be carried out by applying an adhesive tape to the reverse side of the wafer with the die-bonding resin laid thereon, supporting the wafer with a frame having an opening for accommodating the wafer therein, through the adhesive tape, and removing the protective member from the face side of the wafer, and after the transferring step, the dividing step is carried out by picking up the device chips from the adhesive tape.

Preferably, the resin laying step includes a holding step of holding the wafer on a rotatable table while the reverse side of the wafer is being exposed, a coating step of rotating the rotatable table and applying a mist of the die-bonding liquid resin to the reverse side of the wafer, and a laying step of applying an external stimulus to the die-bonding liquid resin applied to the reverse side of the wafer to harden the die-bonding liquid resin, thereby laying the die-bonding resin on the reverse side of the wafer.

The applying step preferably includes applying a mist of the die-bonding liquid resin to the reverse side of the wafer to form a first thin layer on the reverse sides of the individual device chips, and thereafter, depositing a second thin layer on the first thin layer to a predetermined finished thickness. Preferably, each of the first thin layer and the second thin layer may be formed in one cycle to a thickness ranging from 3 to 7 μm.

In the method of processing a wafer according to the present invention, it is possible to apply a die-bonding liquid resin to the reverse sides of individual device chips that are divided, laying a die-bonding resin on the individual device chips. Even if the individual device chips are produced by the "dicing before grinding" step, it is not necessary to carry out an additional step of applying a laser beam to divide a DAF into pieces corresponding to the device chips, as is the case with the related art. Therefore, the productivity of wafers is increased as complex stepes are not required.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A method of processing a wafer according to a preferred embodiment of the present invention will be described in detail below with reference to the accompanying drawings.

(Protective Member Placing Step)

Figure 1A:
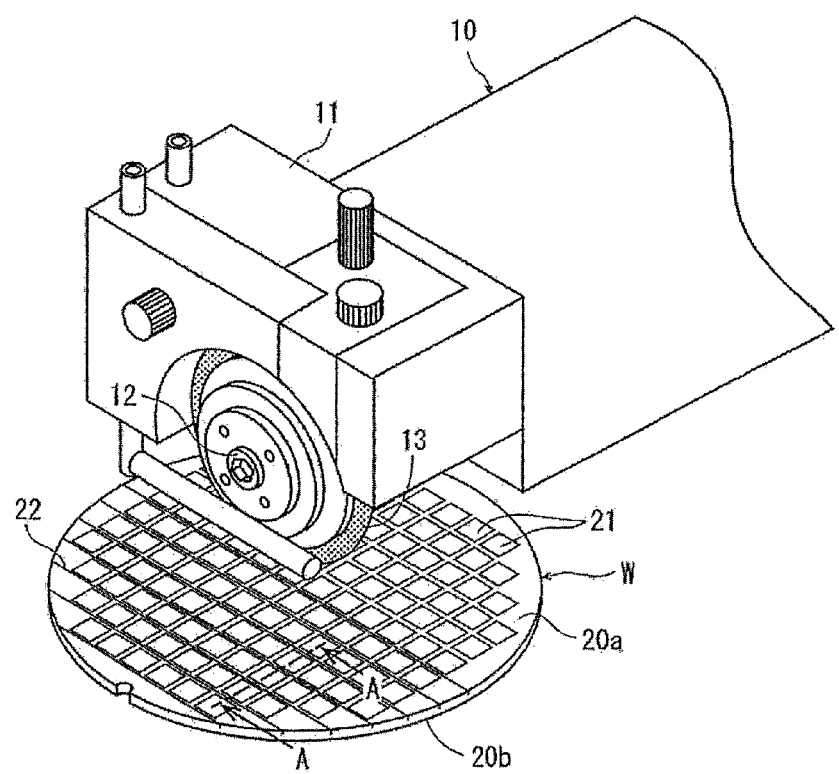
FIG. 1A is a perspective view depicting a portion of a cutting apparatus for carrying out the separation groove forming step.

FIG. 1A depicts the manner in which the step of forming separation grooves is carried out to form separation grooves, each having a depth corresponding to the finished thickness of device chips, in the face side of a semiconductor wafer W along projected division lines formed on the face side of the semiconductor wafer W.

Figure 1B:
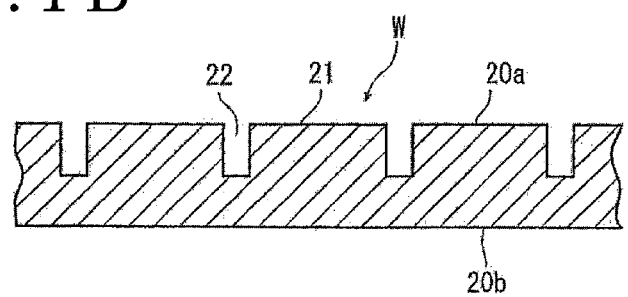
FIG. 1B is a fragmentary cross-sectional view of a semiconductor wafer taken along line A-A of FIG. 1A.

As depicted in FIG. 1A, the step of forming separation grooves is carried out by a cutting apparatus (omitted in its entirety from illustration), having a spindle unit 10. The spindle unit 10 includes a spindle housing 11 which holds a cutting blade 13 fixedly mounted on the tip end of a spindle 12. The semiconductor wafer W to be steped, which has been fabricated to a predetermined thickness of 700 μm, for example, has a face side 20a that is demarcated into a plurality of areas by projected division lines. Devices 21 are formed respectively in the demarcated areas. When the cutting apparatus is in operation, the cutting blade 13 which is being rotated at a high speed together with the spindle 12 is lowered and incised into the semiconductor wafer W whose reverse side 20b is held under suction on a holding table, not depicted, of the cutting apparatus. The holding table and the cutting blade 13 are moved relatively to each other in a processing feed direction, thereby forming a separation groove 22 in the face side 20a along a projected division line. The separation groove 22 has a depth corresponding to the finished thickness of 50 μm, for example, of device chips and a width of 30 μm, for example, as depicted in FIG. 1B, which is a fragmentary cross-sectional view of the semiconductor wafer W taken along line A-A of FIG. 1A. In FIG. 1B, the separation groove 22 is illustrated as exaggerated, but not to actual dimensions.

The cutting apparatus is arranged to control the cutting blade 13 according to a prestored program to move in a processing feed direction along the cutting direction of the cutting blade 13, an indexing feed direction extending parallel to the semiconductor wafer W and perpendicularly to the processing feed direction, and a severance direction along which the cutting blade 13 is vertically displaced toward the semiconductor wafer W. When the step of forming separation grooves is finished after separation grooves 22 as described above have been formed along all of the projected division lines on the semiconductor wafer W, the semiconductor wafer W is removed from the holding table of the cutting apparatus. When the semiconductor wafer W is subsequently ground to a desired finished thickness by a grinding apparatus, to be described later, the semiconductor wafer W may be divided into individual device chips as a result of the grinding step. Consequently, the separation grooves 22, which have been described as being formed to the depth corresponding to the finished thickness of device chips, may be formed to a depth slightly greater than the finished thickness.

Figure 2A:
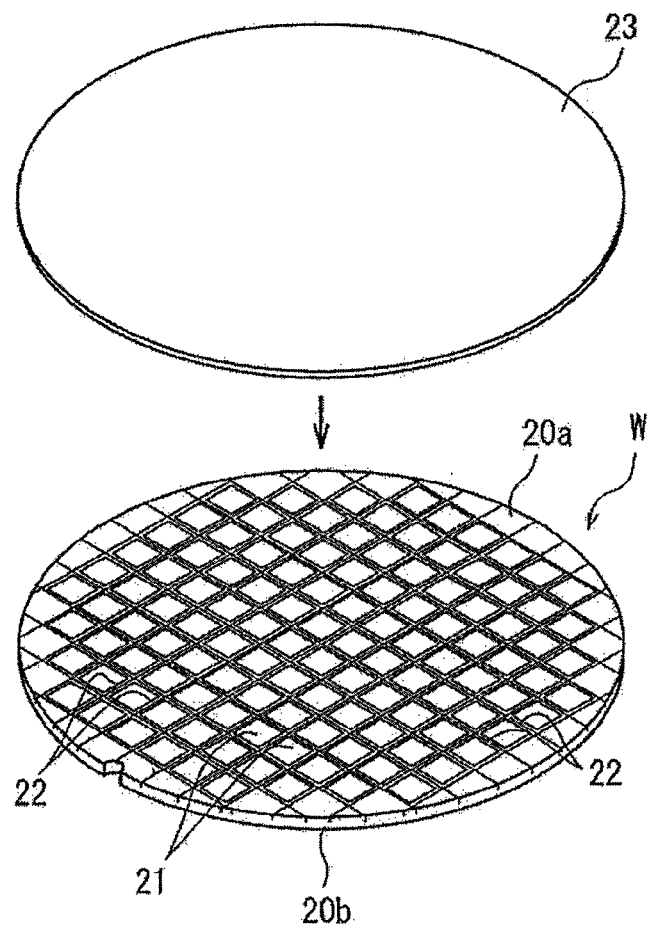
FIGS. 2A and 2B are perspective views depicting the step of applying a protective member.
Figure 2B:
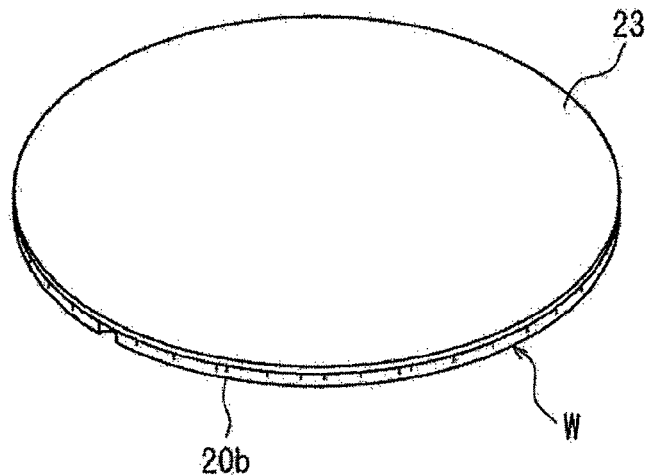

As depicted in FIG. 2A, when the step of forming separation grooves is over, a protective tape 23 that serves as a protective member for protecting the devices 21 is applied to the face side 20a of the semiconductor wafer W (protective member applying step, see FIG. 2B). Then, the protective member applying step is followed by the step of dividing the semiconductor wafer W into individual device chips (dividing step).

Figure 3A:
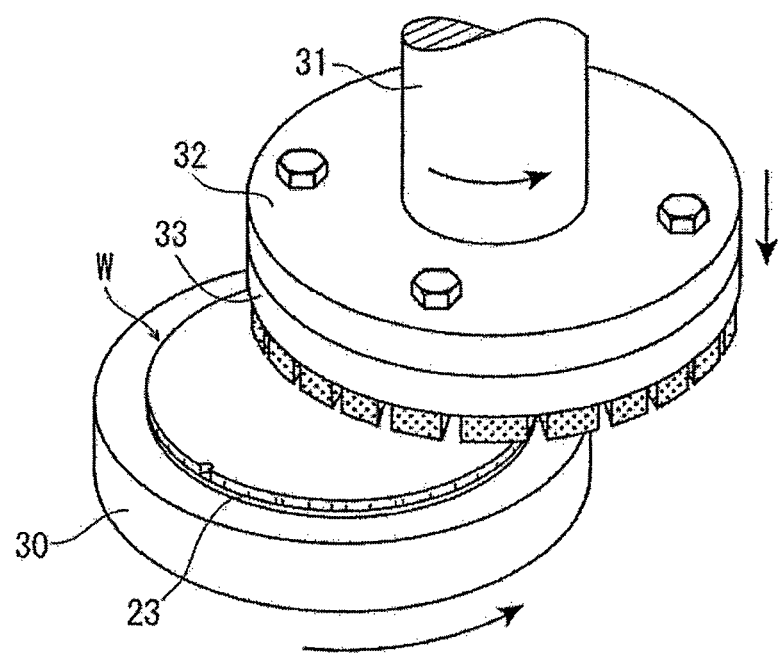
FIGS. 3A and 3B are perspective views depicting the dividing step of dividing the wafer into device chips by grinding the reverse side of the semiconductor wafer.
Figure 3B:
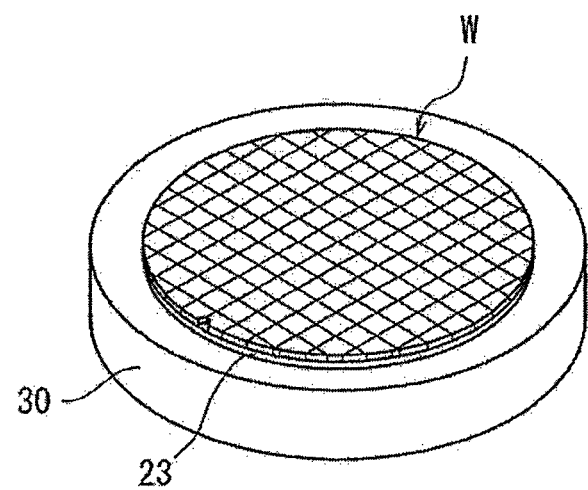

The dividing step will be described below with reference to FIGS. 3A and 3B. As depicted in FIG. 3A, the semiconductor wafer W to which the protective tape 23 has been applied is fixedly mounted on a chuck table 30 of the grinding apparatus with the protective tape 23 facing downwardly and held against the chuck table 30. The chuck table 30, which is rotatable by a motor, not depicted, has an upper surface made of porous ceramics having minute vent pores and is held in fluid communication with suction means, not depicted. When the suction means is actuated, the chuck table 30 holds the semiconductor wafer W under suction on an upper holding surface thereof.

The grinding apparatus also includes a spindle 31 actuatable by a servomotor, not depicted, above the chuck table 30. The spindle 31 is positioned out of axial alignment with the chuck table 30 and has a lower end to which a mounter 32 is attached. To the mounter 32, there is firmly secured by bolts a grinding wheel 33 for grinding the semiconductor wafer W that is held under suction on the chuck table 30. The grinding apparatus has grinding feed means for moving a grinding unit, which includes the spindle 31, the mounter 32, the grinding wheel 33, and the servomotor, in vertical grinding feed directions.

When the grinding feed means is actuated, it presses the grinding wheel 33 against the semiconductor wafer W that is held under suction on the chuck table 30. At this time, the chuck table 30 is rotated in the direction indicated by the arrow at a rotational speed of approximately 300 rpm, and the grinding wheel 33 is rotated in the direction indicated by the arrow at a rotational speed of approximately 6000 rpm while it is being displaced in the downward grinding feed direction at a speed of 1 µm/second. At the same time that the thickness of the semiconductor wafer W is measured by a contact-type or noncontact-type thickness measurement gage, not depicted, the semiconductor wafer W is ground until a desired finished thickness of 50 µm is reached, whereupon, as depicted in FIG. 3B, the separation grooves 22 formed in the step of forming separation grooves are exposed on the reverse side of the semiconductor wafer W. As a result, the semiconductor wafer W is divided into individual device chips. When the semiconductor wafer W is divided into individual device chips, the protective tape 23 provided as the protective member for protecting the devices on the face side of the semiconductor wafer W remains disposed on the individual device chips divided from the semiconductor wafer W. The protective member placing step now comes to an end.

(Resin Laying Step)

Figure 4:
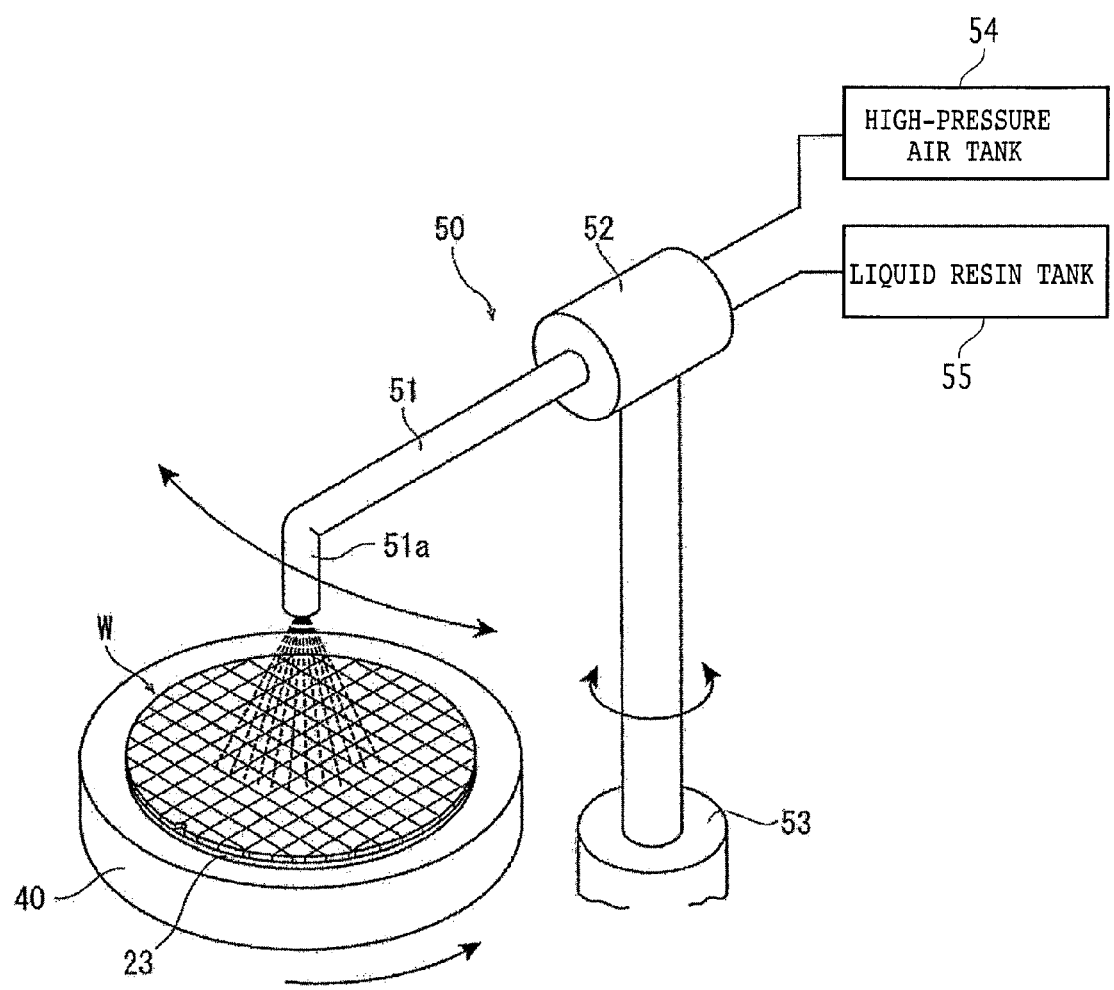
FIG. 4 is a perspective view depicting the step of applying a die-bonding liquid resin in the resin laying step.

A resin laying step according to the present embodiment will be described below with reference to FIGS. 4 and 5. After the protective member applying step has been finished, a holding step is carried out to remove the semiconductor wafer W from the chuck table 30 and, as depicted in FIG. 4, to hold the face side of the semiconductor wafer W on a holding table 40 of a resin laying apparatus (omitted in its entirety from illustration) with the reverse side of the semiconductor wafer W which has been ground in the dividing step facing upwardly. The holding table 40 is of the same structure as the chuck table 30, so that it holds the semiconductor wafer W under suction from suction means, not depicted, and it is rotatable by a servomotor, not depicted.

After the semiconductor wafer W has been held on the holding table 40 in the holding step, a coating step is carried out by a coating unit 50 installed near the holding table 40 of the resin laying apparatus. The coating unit 50 includes a coating nozzle 51 extending so that its tip end 51a is positioned over the semiconductor wafer W held on the holding table 40, a mixing unit 52 for mixing a die-bonding liquid resin (liquid resin), to be described later, and high-pressure air with each other and supplying the mixture to the coating nozzle 51, a swinging unit 53 having an air motor, not depicted, for swinging the coating nozzle 51 of the coating unit 50 parallel along the upper surface of the semiconductor wafer W as indicated by the arrow, a high-pressure air tank 54 for supplying high-pressure air to the mixing unit 52, and a liquid resin tank 55 for supplying a die-bonding liquid resin to the mixing unit 52.

The high-pressure air tank 54 is provided with an air pump and a relief valve, not depicted, which control the high-pressure air in the high-pressure air tank 54 to maintain a constant pressure of 0.3 MPa, for example, therein at all times while the coating unit 50 is in operation. When necessary, the high-pressure air tank 54 supplies high-pressure air to the mixing unit 52. The liquid resin tank 55 is filled with a die-bonding resin that normally remains in a liquid phase, but hardens and functions as a bonding agent when subjected to an external stimulus. The die-bonding resin can be supplied from the liquid resin tank 55 to the mixing unit 52 under a constant pressure by a built-in pump of the liquid resin tank 55. The die-bonding liquid resin includes an ultraviolet-curable adhesive which hardens upon exposure to an ultraviolet radiation applied as an external stimulus. The ultraviolet-curable adhesive may be "HP20VL" or "ST20VL" (trade name) manufactured by Honghow Specialty Chemicals Inc., for example. In addition, a silver-filled epoxy resin which hardens upon exposure to heat applied as an external stimulus, e.g., "Ablebond 8200c" (trade name) manufactured by Ablestik Laboratories, may also be used as the liquid resin.

The mixing unit 52 has a constriction, not depicted, therein for passage of the high-pressure air therethrough. In the mixing unit 52, the liquid resin can be supplied through a slender pipe in a direction perpendicular to the constriction. For spraying the liquid resin from the tip end 51a of the coating nozzle 51, the high-pressure air tank 54 supplies the high-pressure air and the liquid resin tank 55 supplies the liquid resin. When the high-pressure air passes through the constriction in the mixing unit 52, it draws the liquid resin from the slender pipe due to the Venturi effect and atomizes the liquid resin, which is ejected as a mist of the liquid resin from the tip end 51a of the coating nozzle 51 toward the reverse side of the semiconductor wafer W. The mixing unit 52 is not limited to the illustrated structure, but may be constructed as an air brush or the like for use as a generally well-known coating instrument.

A coating step for spraying the liquid resin from the coating nozzle 51 onto the reverse side of the semiconductor wafer W will be further described below. When the semiconductor wafer W is held on the holding table 40 in the holding step as described above, the coating unit 50 is set to a standby state. In the standby state, the tip end 51a of the coating nozzle 51 is set to a position near the semiconductor wafer W, but not over the semiconductor wafer W. This is to prevent large droplets of liquid resin from dropping onto the semiconductor wafer W when the liquid resin starts to be sprayed onto the semiconductor wafer W. For spraying the liquid resin onto the semiconductor wafer W, the holding table 40 starts to rotate at a speed of 500 rpm, for example. Then, the high-pressure air tank 54 starts supplying the high-pressure air, after which the liquid resin tank 55 starts supplying the liquid resin. After the tip end 51a of the coating nozzle 51 has started spraying the liquid resin while the tip end 51a is not positioned over the semiconductor wafer W, the swinging unit 53 starts to actuate the coating nozzle 51. Specifically, while the semiconductor wafer W on the holding table 40 is rotating at the speed referred to above, the tip end 51a of the coating nozzle 51 is caused to swing back and forth above the semiconductor wafer W by the swinging unit 53, during which time the tip end 51a sprays the liquid resin onto the semiconductor wafer W. After the coating nozzle 51 has swung back and forth a preset number of times, e.g., five times, by the swinging unit 53, the coating nozzle 51 is returned to the standby state wherein the tip end 51a is not positioned over the semiconductor wafer W. The high-pressure air tank 54 stops supplying the high-pressure air, and the liquid resin tank 55 stops supplying the liquid resin. The holding table 40 also stops rotating. Since the coating nozzle 51 is swingingly moved back and forth five times, for example, over the semiconductor wafer W while spraying the liquid resin from the tip end 51a toward the semiconductor wafer W, the tip end 51a does not spray an excessively large amount of liquid resin onto the semiconductor wafer W, but sprays an amount of liquid resin which is enough to form a thin film to a thickness ranging from 3 to 7 µm on the semiconductor wafer W.

After the above first cycle of coating operation has been carried out, a certain period of time, e.g., approximately 30 seconds, is allowed to elapse until the die-bonding liquid resin sprayed onto the individual device chips of the semiconductor wafer W becomes stable. Then, the above coating operation for spraying the liquid resin is repeated to form another thin film of liquid resin on the semiconductor wafer W. The coating operation for spraying the liquid resin to form a thin film of liquid resin on the semiconductor wafer W may be repeated a predetermined number of times required to produce a layer of die-bonding liquid resin having a thickness in the range from 10 to 50 µm as a result of hardening in the resin laying step to be described later. The coating step is finished when the coating operation is carried out by the predetermined number of times. In the coating step according to the present embodiment, as described above, the tip end 51a of the coating nozzle 51 sprays a high-pressure liquid resin onto the semiconductor wafer W to form thin films of liquid resin on the individual device chips. At this time, the high-pressure liquid resin is also sprayed into the separation grooves 22, and deposited on the protective tape 23 applied to the bottoms of the separation grooves 22. Since the deposited films of liquid resin in the separation grooves 22 are very thin, the separation grooves 22 will not be filled up with the liquid resin even though the coating operation is repeated a plurality of times, and hence the liquid resin on the reverse sides of the separated individual device chips is deposited as independent films on the respective device chips.

Figure 5:
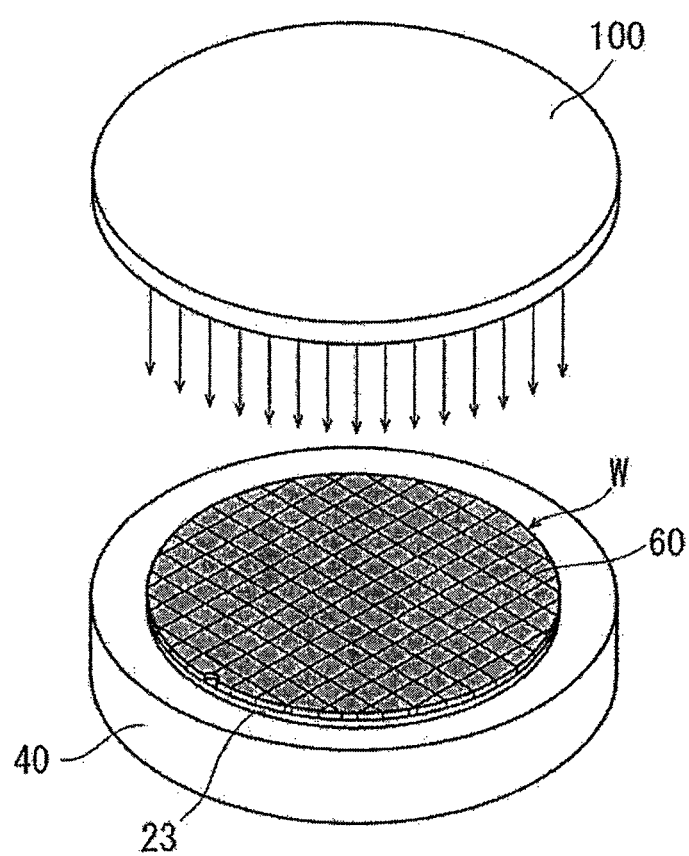
FIG. 5 is a perspective view depicting the step of applying an ultraviolet radiation to the die-bonding liquid resin in the resin laying step.

After the coating step has been completed, as depicted in FIG. 5, the surface coated with the die-bonding liquid resin is irradiated with an ultraviolet radiation from ultraviolet irradiating means 10 as means for applying an external stimulus, hardening the die-bonding liquid resin to lay a die-bonding resin layer 60 on the reverse side of the semiconductor wafer W which has been divided into the individual device chips (laying step). When the above steps from the holding step up to the laying step are carried out, the resin laying step is finished. If a thermosetting resin is used as the die-bonding liquid resin, then heat generated by a heater or the like, rather than the ultraviolet radiation from the ultraviolet irradiating means 10, is applied as an external stimulus to harden the die-bonding liquid resin into the die-bonding resin layer 60 on the reverse side of the semiconductor wafer W.

As described above, since the die-bonding liquid resin is applied to the reverse side of the semiconductor wafer W and then hardened, the die-bonding liquid resin does not flow into the separation grooves, each 30 µm wide, formed between the individual device chips in the separation groove forming step, but remains only on the reverse sides of the device chips, i.e., the die-bonding resin can be laid without the need for the step of dividing the die-bonding resin into pieces corresponding to the individual device chips after the semiconductor wafer W has been divided into the individual device chips by the "dicing before grinding" step.

(Transferring Step)

Figure 6:
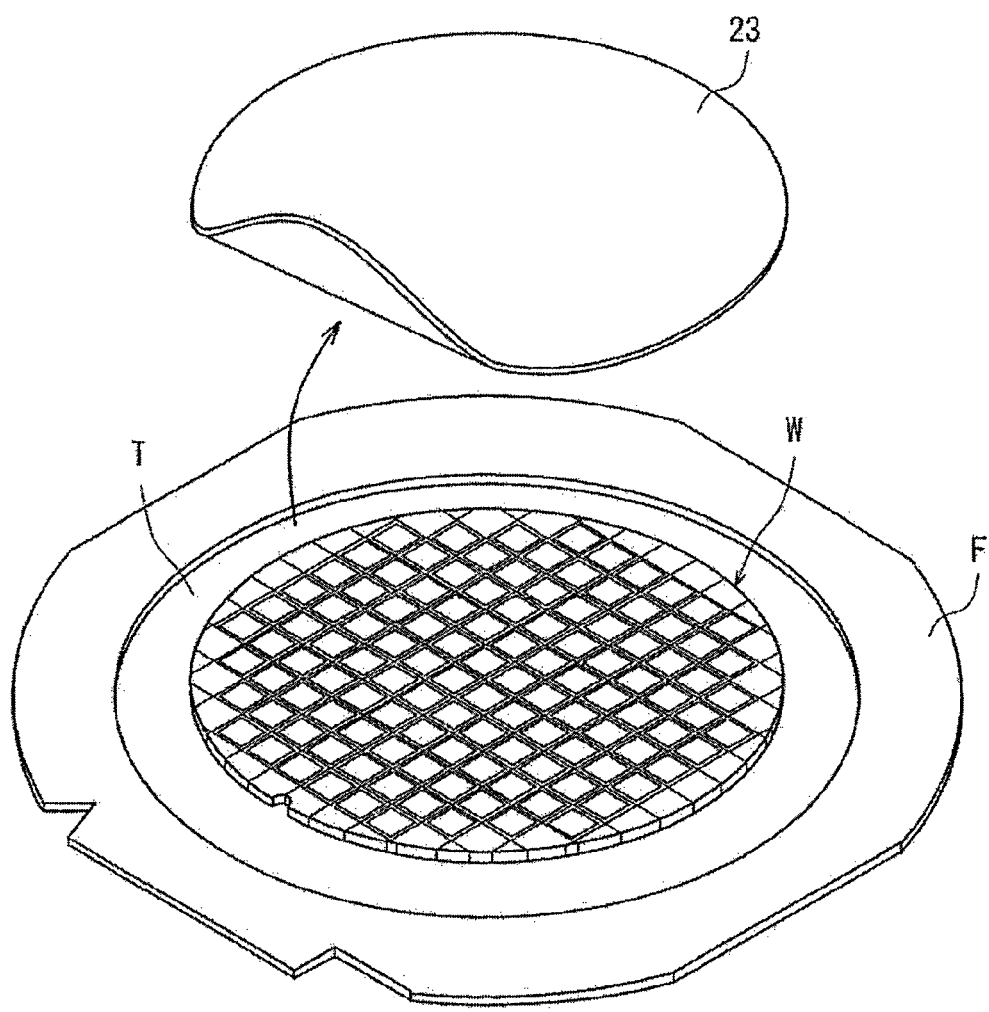
FIG. 6 is a perspective view depicting the step of peeling off the protective member in the transferring step.

After the resin laying step has been finished, a transferring step is carried out. As described above, after the resin laying step has been finished, no die-bonding resin has entered the separation grooves 22 of the semiconductor wafer W, and the individual device chips are joined together only by the protective tape 23. The semiconductor wafer W is then removed from the holding table 40 of the resin laying apparatus, and, as depicted in FIG. 6, the reverse side of the semiconductor wafer W, i.e., the surface thereof on which the die-bonding resin layer 60 is formed, is applied to the surface of a highly elastic adhesive tape T whose outer peripheral region is mounted on an annular frame F in a manner to cover an inner opening of the annular frame F. Then, the protective tape 23 that has protected the face side 20a of the semiconductor wafer W is peeled off, whereupon the transferring step is finished.

(Separating Step)

When the transferring step is finished, a separating step for separating the device chips with the resin laid on their reverse sides from the semiconductor wafer W is carried out. The separating step is carried out by a separating apparatus 70 which is partly depicted in FIG. 7. The separating apparatus 70 includes a frame holding member 71, a plurality of clamps 72 for holding the annular frame F on an upper surface of the frame holding member 71, and an expanding drum 73 having an upwardly open cylindrical shape for expanding the semiconductor wafer W mounted on the annular frame F that is held in position by the clamps 72. The frame holding member 71 is vertically movably supported by supporting means 723 which includes a plurality of air cylinders 723a disposed in surrounding relation to the expanding drum 73 and a plurality of piston rods 723b extending from the air cylinders 723a.

Figure 7:
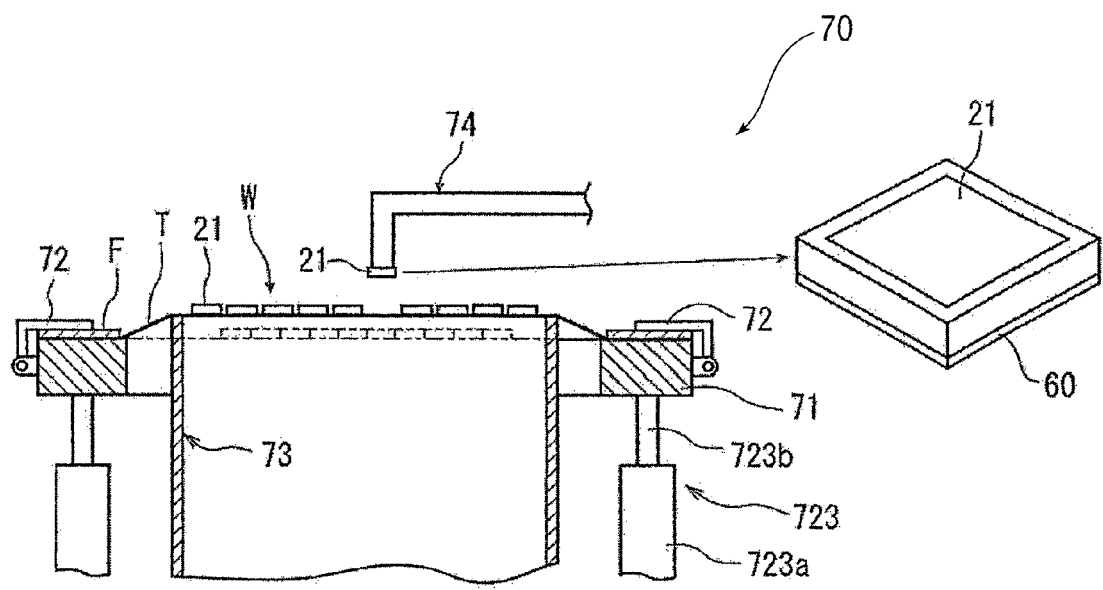
FIG. 7 is a cross-sectional view depicting the separation step of separating device chips from a semiconductor wafer.

The expanding drum 73 has an outside diameter smaller than the inside diameter of the annular frame F and has an inside diameter larger than the outside diameter of the semiconductor wafer W applied to the adhesive tape T which is mounted on the annular frame F. As depicted in FIG. 7, the separating apparatus 70 can selectively take a position (indicated by the dotted lines) where the upper end of the frame holding member 71 and the upper end of the expanding drum 73 lie substantially flush each other and a position (indicated by the solid lines) where the upper end of the expanding drum 73 is higher than the upper end of the frame holding member 71 when the supporting means 723 lowers the frame holding member 71.

When the frame holding member 71 is lowered to relatively change the upper end of the expanding drum 73 from the position indicated by the dotted lines to the position indicated by the solid lines where the upper end of the expanding drum 73 is higher than the upper end of the frame holding member 71, the adhesive tape T mounted on the annular frame F is brought into contact with and expanded by the upper end of the expanding drum 73. As a result, tensile forces are radially exerted on the semiconductor wafer W applied to the adhesive tape T, spreading the clearances between the individual device chips divided along the separation grooves 22. While the individual device chips are being thus spaced apart, a pickup collet 74 is actuated to attract one at a time of the divided device chips, peel off and pick up the device chip from the adhesive tape T, and transport the device chip to a die-bonding step for bonding the device chip to a tray or lead frame, not depicted. The separation step now comes to an end, whereupon the method of processing a wafer according to the present embodiment is finished.

In the step of forming separation grooves, which serves as part of the step of applying a protective member, as described above, the cutting blade 13 mounted on the tip end of the spindle 12 is rotated and pressed against the face side 20a of the semiconductor wafer W to form separation grooves 22 therein. However, separation grooves may be formed by any of various other stepes, rather than the illustrated step. For example, as disclosed in Japanese Patent Laid-Open No. 2006-294913, separation grooves may be formed in a wafer by a dry etching step such as a reactive ion etching step in which a gas is ionized and turned into radicals by a plasma or a wet etching step which uses various liquids selected depending on the material of the wafer. According to still another step, separation grooves may be formed in a wafer by a laser processing step which uses a laser beam having a wavelength absorbable by the surface of the wafer.

As described above, for applying the die-bonding liquid resin to the semiconductor wafer in the resin laying step, the die-bonding liquid resin is ejected toward the reverse side of the semiconductor wafer. At this time, the pressure of the high-pressure air, the rate at which the die-bonding liquid resin is supplied from the liquid resin tank, or the ratio at which the die-bonding liquid resin and the high-pressure air are mixed with each other is such that the particle diameter of the sprayed liquid resin droplets should preferably be small and the rate per unit time at which the liquid resin is sprayed should preferably be small. If the particle diameter of the sprayed liquid resin droplets is too large or the rate per unit time at which the liquid resin is sprayed is too large, then the applied liquid resin tends to enter the separation grooves 22 exposed on the reverse side of the semiconductor wafer, filling up the separation grooves 22, resulting in a need for the additional step of dividing the semiconductor wafer as is the case with the related art described above. Consequently, conditions such as the rate per unit time at which the liquid resin is supplied and the pressure of the high-pressure air that affects the particle diameter of the sprayed liquid resin droplets should be selected so as not to let the liquid resin enter the separation grooves, in view of the width of the separation grooves, the viscosity of the liquid resin, etc.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer with a plurality of devices formed in areas demarcated by projected division lines on a face side thereof, comprising:
   a protective member placing step of placing a protective member for protecting the face side of the wafer on the face side of the wafer which is divided into individual device chips;
   a resin laying step of laying a die-bonding resin on the reverse sides of the individual device chips by applying a die-bonding liquid resin on the reverse side of the wafer and hardening the applied die-bonding liquid resin; and
   a separating step of separating the device chips with the die-bonding liquid resin laid on the reverse sides thereof from the wafer;
   the wafer processing method further comprising:
   a transferring step of, after the resin laying step, transferring the wafer by applying an adhesive tape to the reverse side of the wafer with the die-bonding resin laid thereon, supporting the wafer with a frame having an opening for accommodating the wafer therein, through the adhesive tape, and removing the protective member from the face side of the wafer;
   wherein after the transferring step, the separating step is carried out by picking up the device chips from the adhesive tape.

2. The wafer processing method according to claim 1, wherein the protective member placing step includes:
   a separation groove forming step of forming separation grooves corresponding to a finished thickness of the device chips, in the face side of the wafer along the projected division lines before the protective member is placed on the face side of the wafer;
   a protective member applying step of applying the protective member to the face side of wafer with the separation grooves formed therein; and
   a dividing step of dividing the wafer into the individual device chips by thinning the wafer to expose the separation grooves on the reverse side of the wafer.

3. The wafer processing method according to claim 2, wherein the separation groove forming step includes:
   causing a cutting blade to cut into the face side of the wafer along the projected division lines to form separation grooves having a depth corresponding to the finished thickness of the device chips.

4. The wafer processing method according to claim 2, wherein the separation groove forming step includes:
   carrying out a wet etching step or a dry etching step to form separation grooves having a depth corresponding to the finished thickness of the device chips, along the projected division lines.

5. The wafer processing method according to claim 2, wherein the separation groove forming step includes:
   applying a laser beam along the projected division lines to form separation grooves having a depth corresponding to the finished thickness of the device chips.

6. The wafer processing method according to claim 2, wherein the dividing step includes:
   grinding the reverse side of the wafer to thin the wafer, thereby exposing the separation grooves on the reverse side of the wafer.

7. The wafer processing method according to claim 1, wherein the resin laying step includes:
   a holding step of holding the wafer on a rotatable table while the reverse side of the wafer is being exposed;
   a coating step of rotating the rotatable table and applying a mist of the die-bonding liquid resin to the reverse side of the wafer; and
   a laying step of applying an external stimulus to the die-bonding liquid resin applied to the reverse side of the wafer to harden the die-bonding liquid resin, thereby laying the die-bonding resin on the reverse side of the wafer.

8. The wafer processing method according to claim 7, wherein the coating step includes:
   applying a mist of the die-bonding liquid resin to the reverse side of the wafer to form a first thin layer on the reverse sides of the individual device chips; and thereafter, depositing a second thin layer on the first thin layer to a predetermined finished thickness.

9. The wafer processing method according to claim 8, wherein, in the coating step, each of the first thin layer and the second thin layer is formed in one cycle to a thickness ranging from 3 to 7 μm.

\* \* \* \* \*